(12) United States Patent
Unnikrishnapillai

(10) Patent No.: US 11,874,693 B2
(45) Date of Patent: Jan. 16, 2024

(54) RECONFIGURABLE CLOCK DIVIDER

(71) Applicant: Analog Devices International Unlimited Company, Limerick (IE)

(72) Inventor: Krishnan Unni Unnikrishnapillai, Bangalore (IN)

(73) Assignee: Analog Devices International Unlimited Company, Limerick (IE)

( * ) Notice: Subject to any disclaimer, the term of this patent is extended or adjusted under 35 U.S.C. 154(b) by 108 days.

(21) Appl. No.: 17/752,498

(22) Filed: May 24, 2022

(65) Prior Publication Data

US 2023/0384819 A1 Nov. 30, 2023

(51) Int. Cl.
*G06F 1/00* (2006.01)
*G06F 1/08* (2006.01)
*G06F 1/10* (2006.01)

(52) U.S. Cl.
CPC . *G06F 1/08* (2013.01); *G06F 1/10* (2013.01)

(58) Field of Classification Search
CPC ..................................... G06F 1/08; G06F 1/10
See application file for complete search history.

(56) References Cited

U.S. PATENT DOCUMENTS

| | | | |
|---|---|---|---|
| 4,623,846 A | 11/1986 | Lamacchia | |
| 5,410,683 A | 4/1995 | Al-khairi | |
| 5,524,035 A | 6/1996 | Casal et al. | |
| 5,623,223 A | 4/1997 | Pasqualini | |
| 5,920,216 A | 7/1999 | Fischer | |
| 6,956,414 B2 | 10/2005 | Sweet | |
| 6,956,793 B2 | 10/2005 | Ngo | |
| 7,328,229 B2 | 2/2008 | Govindarajan | |
| 7,656,244 B2 | 2/2010 | Mccorquodale et al. | |
| 7,940,667 B1 | 5/2011 | Coady et al. | |
| 8,299,827 B2 | 10/2012 | Subburaj et al. | |
| 8,373,472 B2 | 2/2013 | Thaller et al. | |
| 8,760,325 B2 | 6/2014 | Ryan | |
| 8,929,498 B2 | 1/2015 | Hoang | |
| 9,438,257 B1 | 9/2016 | Perdoor et al. | |
| 9,762,228 B2 | 9/2017 | Agrawal et al. | |
| 10,749,530 B1 | 8/2020 | Kumar | |

(Continued)

FOREIGN PATENT DOCUMENTS

| | | |
|---|---|---|
| CN | 102843134 B | 9/2015 |
| EP | 2718780 A1 | 4/2014 |
| WO | WO-9007232 A1 | 6/1990 |

*Primary Examiner* — Mohammed H Rehman

(74) *Attorney, Agent, or Firm* — Schwegman Lundberg & Woessner, P.A.

(57) ABSTRACT

A dynamically configurable clock divider may include a multifrequency clock divider circuit for generating a programmable frequency output clock signal from a given frequency input clock signal may include a first counter, and a second counter. The second counter may alternate between an active state and an inactive state with opposite states of the first counter to control delivery of the programmable frequency clock signal. When the first counter is programmed to be transitioned from the inactive state to the active state, the second counter may continue to maintain the active state and a previous frequency value of the output clock signal for a predetermined number of clock signals before transitioning to the inactive state and handing control of the output clock signal to the first counter which assumes the active state.

20 Claims, 8 Drawing Sheets

(56) References Cited

U.S. PATENT DOCUMENTS

| | | | |
|---|---|---|---|
| 11,144,086 B1* | 10/2021 | Ofir | G06F 1/08 |
| 2004/0267848 A1 | 12/2004 | Govindarajan | |
| 2005/0213699 A1 | 9/2005 | Boerstler et al. | |
| 2006/0220697 A1* | 10/2006 | Flynn | H03K 23/68 |
| | | | 327/105 |
| 2010/0128836 A1* | 5/2010 | Palmer | G06F 1/08 |
| | | | 377/47 |
| 2014/0035635 A1 | 2/2014 | Rao et al. | |
| 2014/0185736 A1* | 7/2014 | Chandrashekar | H03K 23/542 |
| | | | 377/48 |
| 2022/0170968 A1* | 6/2022 | Van Elzakker | H03L 7/07 |

* cited by examiner

329
RECONFIGURABLE CLOCK DIVIDER

TECHNOLOGICAL FIELD

The present disclosure relates to electronics, and more particularly, but not by way of limitation, to a clock divider that can be dynamically reconfigured to change division value in a predictable manner.

BACKGROUND

Electronic systems can use a clock signal to synchronize the operations of digital circuits. For example, a clock signal can oscillate between low and high binary signal values at a specified frequency and with approximately a 50 percent duty cycle. The digital circuits using the clock signal for synchronization may operate using the rising edge or using the falling edge of the clock signal. The frequency of the clock signal may be selected to maximize data throughput while allowing the digital circuits sufficient time to operate. Additionally, the frequency of the clock signal may be selected to reduce or minimize resource and energy use.

SUMMARY

The clock signal frequency may need to be changed during the operation of the electronic system using the clock. The present inventor has recognized that a problem with changing the clock signal frequency is the potential for glitching or unpredictable latency when switching between different clock division frequencies. This document describes, among other things, a clock divider that is reconfigurable and predictable, such as by using two counters that can interact with each other to provide a smooth handoff when switching between different clock division frequencies.

In an example, a multifrequency clock divider circuit for generating a programmable frequency output clock signal from a given frequency input clock signal may include a first counter, and a second counter. The second counter may alternate between an active state and an inactive state with opposite states of the first counter to control delivery of the programmable frequency clock signal. When the first counter is programmed to be transitioned from the inactive state to the active state, the second counter may continue to maintain the active state and a previous frequency value of the output clock signal for a predetermined number of clock signals before transitioning to the inactive state and handing control of the output clock signal to the first counter which assumes the active state.

In an example, a method for changing a frequency value of a programmable frequency output clock signal generated from a given frequency input clock signal from a previous frequency value to a new frequency value may include receiving an input indicating the new frequency value, receiving an input synchronization signal, and receiving an "Allow New Clock" signal. In response to the input synchronization signal, the method may include starting, and delaying enabling, an output clock signal having the new frequency value and shutting down the output clock signal having the previous frequency value. In response to receiving an "Allow New Clock" signal the method may include suppressing the output clock signal having the previous frequency value and enabling the output clock signal having the new frequency value.

In an example, a multifrequency clock divider system for generating at least one programmable frequency output clock signal from a given frequency input clock signal may include clock divider controller circuitry, and at least one multifrequency clock divider circuit. The at least one multifrequency clock divider circuit may include a first counter, and a second counter. The second counter may alternate between an active state and an inactive state with opposite states of the first counter to control the delivery of the programmable frequency clock signal. When the first counter is programmed to be transitioned from the inactive state to the active state, the second counter may continue to maintain the active state and a previous frequency value of the output clock signal for a predetermined number of clock signals before transitioning to the inactive state and handing control of the output clock signal to the first counter which assumes the active state. The clock divider controller circuitry may interact with the at least one multifrequency clock divider circuit to establish the at least one programmable frequency output clock signal having a programmable frequency value.

DETAILED DESCRIPTION

The present disclosure relates to a clock divider circuit that is reconfigurable and predictable. The multifrequency clock divider circuit can be used in a variety of systems, such as in a radio-frequency converter circuit. The clock divider system may provide a programmable frequency output clock signal generated from a given frequency input clock signal to one or more components of an electronic circuit. The frequency of the clock signal supplied may be the same for all the components or the frequency of the clock signal supplied may vary between components.

While operating the electronic circuit, it may be desirable to change the frequency of the clock signal provided to one or more of the circuit components without having to stop the entire circuit or shut down one or more of its components. This dynamic clock frequency change can be performed such that the clock signals of varying frequencies are sequenced or synchronized to help data flow through the various components sequentially and to help ensure that the previous frequency clock signal does not create any clock glitches or other signals that could cause circuit stability issues when a previous clock is shut off.

Figure 1:
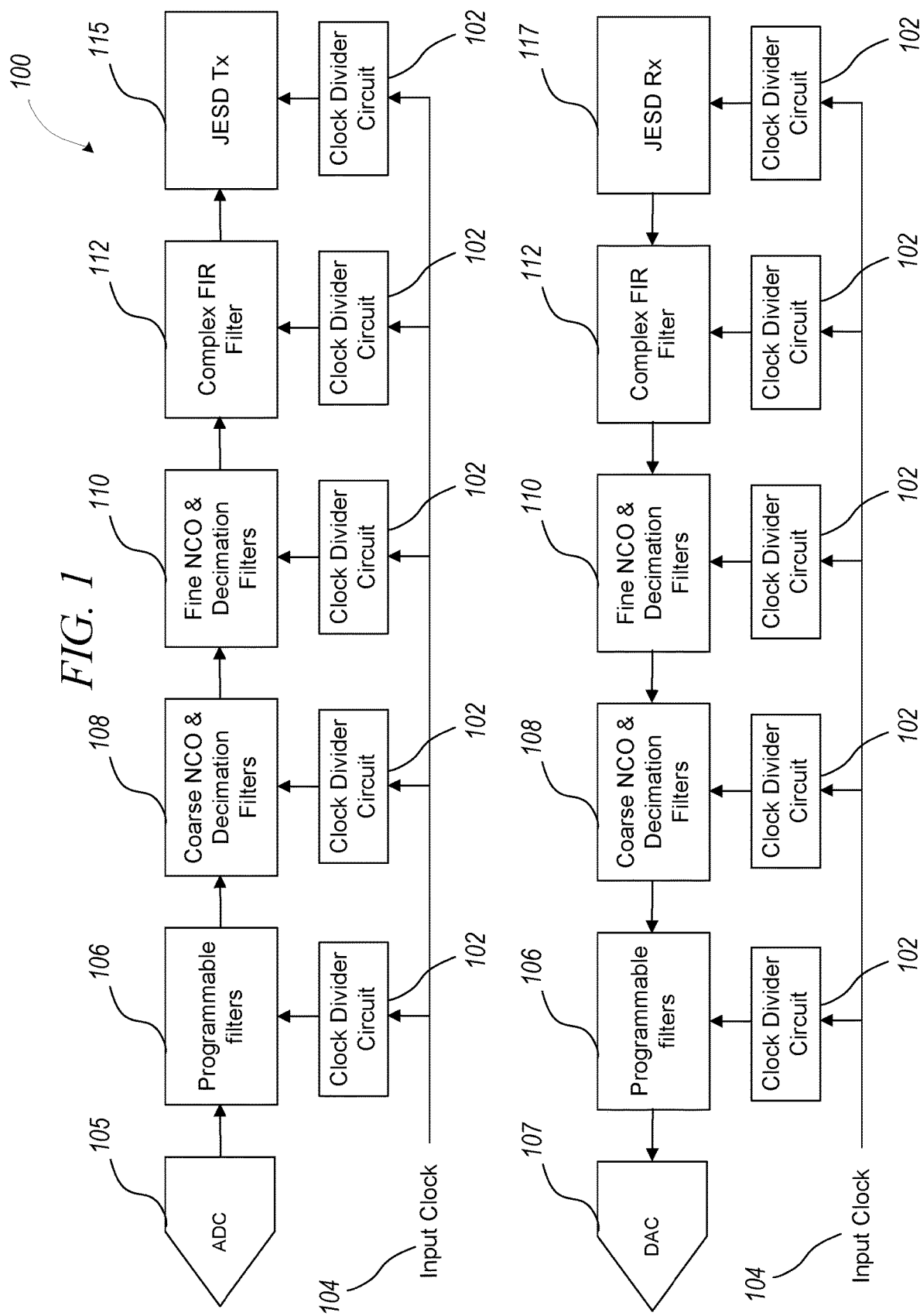
FIG. 1 is a schematic drawing of an example of portions of a clock divider circuit and portions of an example of a system in which the clock divider circuit can be used.

FIG. 1 is a schematic diagram of an example of portions of a radio-frequency converter circuit 100 with multiple clock divider circuits 102 feeding various circuit components. The radio-frequency converter circuit 100 receives analog input data at an analog to digital converter 105 and passes the resulting digital data stream sequentially through a series of various circuit components. The multiple clock divider circuits 102 may all supply the same clock signal to each of the various circuit components, or the multiple clock divider circuits 102 may supply clock signals with differing frequencies to one or more of the various circuit components. In an example, the frequencies of the clock divider circuits 102 generally sequentially one of increases or decreases along the data stream path. From the final circuit component, the processed data stream may be fed to a program, to a hardwired circuit, to another system, or discarded.

FIG. 1 also shows a radio-frequency converter circuit 100 feeding a digital data stream to a digital to analog converter 107. The digital data stream is produced by passing an initial data stream sequentially through a series of various circuit components. The multiple clock divider circuits 102 may all supply the same clock signal to each of the various circuit components, or the multiple clock divider circuits 102 may supply clock signals with differing frequencies to one or more of the various circuit components. In an example, the frequencies of the clock divider circuits 102 generally sequentially one of increases or decreases along the data stream path. The initial data stream may come from a program, a hardwire circuit, electrical noise, or some other source. The output data stream may be fed into an electrical input, an antenna, or some other receiver.

The sequence of various circuit components may include a cascade of one or any combination of one or more programmable filters 106, one or more coarse Number Controlled Oscillator (NCO) and decimation filters 108, one or more fine NCO and decimation filters 110, one or more complex FIR filters 112, a JESD transmitter circuit 115 and or a JESD receiver circuit 117. The data may pass serially between the various circuit components sequentially, or it may skip one or more of the various circuit components. Each of the various circuit components may process the same amount of data as the other various circuit components, or one or more of the various circuit components may process more or less data than the other various circuit components. In an example, the amount of data passed generally sequentially one of increases or decreases along the data stream path. In an example, the frequency of the clock divider circuits 102 generally sequentially one of increases or decreases with the amount of data passed. This may allow the downstream blocks to perform upsampling or downsampling or to perform quicker or more complex and precise operations, or may serve to help reduce minimize or otherwise tailor power consumption.

Figure 2:
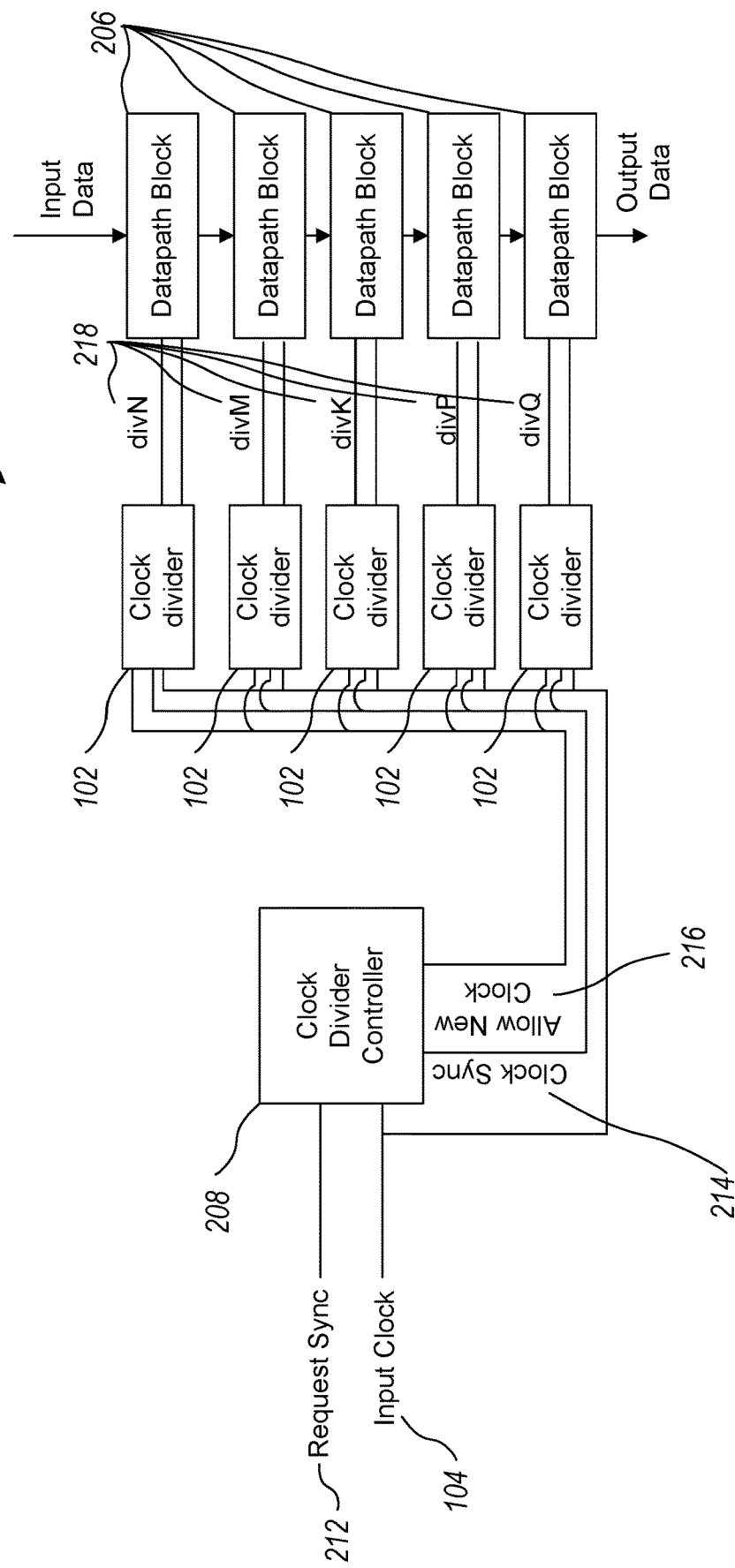
FIG. 2 is a schematic drawing of an example of portions of a clock divider system.

FIG. 2 is a schematic diagram of an example of portions of a clock divider circuit system 200. In the example of FIG. 2, the clock divider circuit system 200 can include multiple clock divider circuits 102 providing corresponding clock signals to various datapath block circuit components 206. The clock divider circuit system 200 can also include a clock divider controller circuit 208. The clock divider controller 208 may receive as inputs a request synchronization (request sync) signal 212 and an input clock signal 104. The clock divider controller 208 may produce as outputs a clock synchronization (clock sync) signal 214 and an "allow new clock" signal 216. Each of the multiple clock divider circuits 102 may receive as inputs an input clock signal 104, a clock sync signal 214 generated by the clock divider controller 208, and an allow new clock signal 216 generated by the clock divider controller 208. Each of the multiple clock divider circuits 102 may produce as outputs a divided clock signal 218. The divided clock signal 218 may represent a division of the input clock signal 104, such as by any integer value, such as to produce a resulting lower clock frequency divided clock signal 218. However, the input clock signal may be divided by the integer 1 to match the frequency of the divided clock signal 218 to the frequency of the input clock signal 104, if desired.

The clock divider controller 208 may also accept as inputs information about the division value of one or more the clock divider circuits 102, information about the current state and timing of one or more of the divided clock signals 218, or both of these. The clock divider controller 208 may interact with one or more of the clock divider circuits 102 to establish one or more divided clock signals 218. The clock divider controller 208 may use one or more of the inputs it accepts to facilitate a clock frequency change on one or more of the clock divider circuits 102. The clock divider controller 208 may initiate the change sequence following receipt of the request sync signal 212. The clock divider controller 208 may schedule its output signals so that one or more of the clock divider circuits 102 does not create a glitched clock signal. A glitched clock signal could be a signal that is shorter or much shorter in a particular binary state than previous clock signals, or a clock signal whose waveform does not follow the same form as the previous clock signal waveforms. The previous clock signal waveforms may represent the steady-state operation of the clock divider circuit 102, such as after waiting a sufficiently long period of time following a clock frequency change by the clock divider controller 208.

The clock divider controller 208 may schedule its output signals so that one or more of the clock divider circuits 102 create a divided clock signal 218 that has a known relation to one or more of the other divided clock signals 218. In an example, the clock divider controller 208 may schedule its output signals so that one or more of the clock divider circuits 102 create a divided clock signal 218 with one of the rising edge or the falling edge initially aligned with one of the rising edge or the falling edge of the divided clock signal 218 of one or more of the other clock divider circuits 102. This edge alignment can help better synchronize operation of the various datapath block circuit components 206. In an example, the timing at which the data passes between various circuit components may be synchronized to the time at which one or more of the clock divider circuits 102 have one of a rising or falling edge aligned to one of a rising or falling edge of one or more of the other clock divider circuits 102.

The clock divider controller 208 may schedule its output signals using one or more mathematical, logical, or other operations. In an example, the clock divider controller 208 may use a least-common-multiple (LCM) operation. The LCM operation may be performed by dedicated circuitry in the clock divider controller 208, or the clock divider controller 208 may perform the LCM operation using a non-specialized logical or mathematical processing circuit. In an example, the clock divider controller 208 may offload a portion or all of LCM operations to another circuit that may be more powerful or specifically suited to the task.

In an example, one or more of the divided clock signals 218 are periodic and have a period equal to a specified number of cycles of the input clock 104. The LCM of the periods of the one or more of the individual divided clock signals 218 may provide the shortest number of cycles of the input clock 104 from the current cycle until the one or more divided clock signals 218 return to their current state in their periodic cycle. In an example, the period of one or more of the divided clock signals 218 in cycles of the input clock 104 is equal to the division value (e.g., divN, divM, divK, divP, divQ) of the divided clock signal 218. The clock divider controller 208 may use the LCM of one or more of the individual division values of the divided clock signals 218 to determine the earliest time at which the system will be in a desired alignment with one or more divided clock signals 218 rising or falling edge aligned to the rising or falling edge of one or more of the other divided clock signals 218. In an example, the clock divider controller 208 may determine that the system is in a desired alignment by having a record of a cycle of the input clock 104 at which the system was in a desired alignment and also having a record of the number of input clock signal 104 cycles since. Then, the clock divider circuit may subtract the number of input clock 104 cycles since the desired alignment from the LCM of one or more of the division values to determine the number of input clock signal 104 cycles until the system is in a desired alignment again.

The clock divider controller 208 may then use this determination of the earliest time that the system will be in a desired alignment to schedule its output signals so that one or more of the divided clock signals 218 are in a desired alignment following a change in division value. In an example, the desired alignment after the change in division value may be the same as the desired alignment before the change in division value. In an example, the desired alignment after the change in division value may be different than the desired alignment before the change in division value. In an example, a desired alignment may exist when one or more divided clock signals 218 rising or falling edge is offset by a certain number of input clock signal 104 cycles from the rising or falling edge of one or more of the other divided clock signals 218.

In an example, the clock divider controller 208 uses the LCM of all of the division values of the divided clock signals 218 to determine the time of the next desired alignment. This can help ensure that the rising or falling edges of all divided clock signals 218 will be in a desired alignment no matter which clock divider circuit 102 has its division value altered. In an example, the clock divider controller 208 uses the LCM of all of the division values of the divided clock signals 218 except for those whose frequency is programmed to be changed. This can help ensure that the rising or falling edges of all divided clock signals 218 will be in a desired alignment after the programmed frequency change or changes, and may result in a lower LCM value and therefore a quicker change in clock frequency value.

The clock divider controller 208 may include or use a countdown counter, such as to keep track of the number of cycles of the input clock signal 104 until one or more of the divided clock signals 218 are in a desired alignment. In an example, the clock divider controller 208 outputs the "allow new clock" signal after two complete counts of the LCM value following the receipt of the request sync signal 212.

Figure 3:
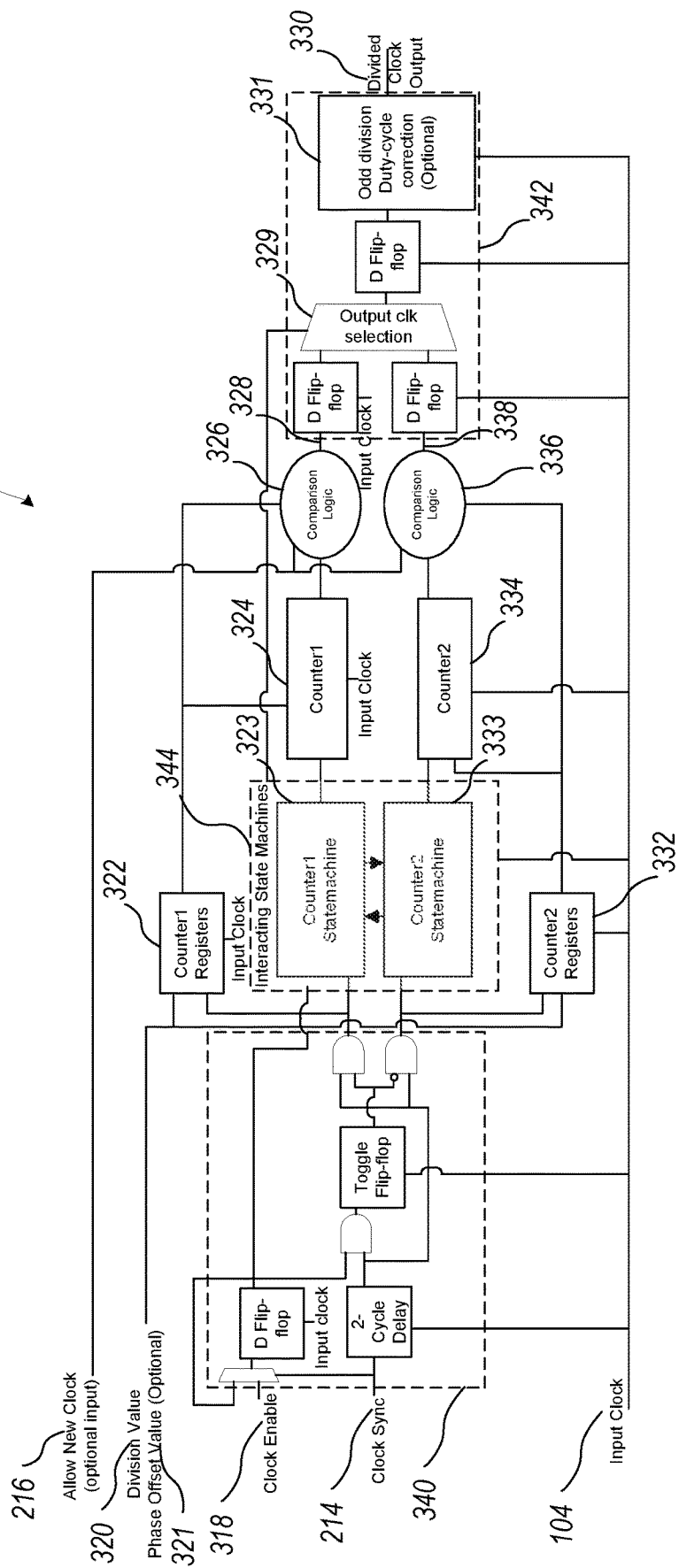
FIG. 3 is a schematic drawing of an example of portions of a clock divider circuit.

FIG. 3 shows a schematic diagram of an example of portions of the multifrequency clock divider circuit 102. In FIG. 3, the clock divider circuit 102 may accept as inputs an "allow new clock" signal 216, a clock division value 320, a clock enable signal 318, a clock sync signal 214, and an input clock signal 104. The clock divider circuit 102 may produce as outputs a divided clock output signal 330. The clock divider circuit 102 may include a first (Counter 1) register 322, a first (Counter 1) state machine 323, a first (Counter 1) counter 324, a first (Counter 1) comparison logic 326, and a first (Counter 1) output clock signal 328. Additionally, the clock divider circuit 102 may include a second (Counter 2) register 332, a second (Counter 2) state machine 333, a second (Counter 2) counter 334, second (Counter 2) comparison logic 336, and a second (Counter 2) output clock signal 338. The components connected and interacting with the first counter 324 may be similar in design, construction, and arrangement to those connected and interacting with the second counter 334, or they may be different. FIG. 3 also includes an input handling circuit 340, an output handling circuit 342, an output clock selection circuit 329, duty cycle correction circuitry 331, and interacting state machines 344.

The allow new clock signal 216 may be provided by a clock divider controller 208, another circuit output, or any other source. The allow new clock signal 216 may be controlled by a program directly, by a discrete logic circuit, or by a discrete logic circuit in combination with a program. Alternatively, the allow new clock signal 216 may be internally generated by the clock divider circuit 102 such that no external allow new clock signal 216 is required for the clock divider circuit 102 to operate. If the allow new clock signal 216 is internally generated, the internal generation circuitry can be configured to ensure proper timing of the allow new clock signal 216. The allow new clock signal 216 may be connected to the comparison logic components 326 and 336.

In examples in which the allow new clock signal 216 is internally generated, the clock divider circuit 102 may contain an internal parameter, X, that specifies how many clock cycles the new clock division value clock must go through before sending the allow new clock signal. In an example the value of X may be selected to ensure that the old output clock will be able to complete at least one full cycle before the allow new clock signal is sent. In an example the value of X may be selected to ensure that the old output clock will be able to complete at least two full cycles, or portions of two cycles, before the allow new clock signal is sent.

The clock division value 320 may be provided by a program output, a discrete circuit component, or any other source. Additionally, the clock division value 320 may be hardcoded into the clock divider circuit 102. The clock division value 320 may come in the form of a binary number carried by high and low signals or any other form. The clock division value 320 may be connected to the first register 322 and the second register 332.

The clock enable signal 318 may be provided by a program output, a discrete circuit component, or any other source. In an example, the clock enable signal is hardcoded to be always on or always off. In an example, the clock divider circuit 102 does not accept a clock enable signal 318. The clock enable signal may be connected to the input handling circuit 340.

The clock sync signal 214 may be provided by a clock divider controller 208, a program output, a discrete circuit component, or any other source. The clock sync signal 214 may be connected to the input handling circuit 340. The clock sync signal 214 may be received asynchronously, and may not be processed until the next cycle of the input clock signal 104 or the divided clock output signal 330.

The input clock signal 104 has a given frequency and may be provided by a program clock, an auxiliary clock, or a dedicated clock generator circuit. The input clock signal 104 may be used for driving and synchronizing the clock divider circuit 102, as well as for providing a clock signal to be divided. The given frequency of the input clock signal 104 may remain generally constant over time or may vary.

The divided clock output signal 330 may have a frequency equal to an integer division of the frequency of the input clock signal 104. The divided clock output signal 330 may also have a frequency matching the input clock signal 104. This matching frequency may be produced by using a division value of one or by bypassing one or more portions of the clock divider circuit 102 and outputting the input clock signal 104 directly. The divided clock output signal 330 may take the form of a square wave, a sinusoid, or any other clock wave. The divided clock output signal 330 may have a form matching the input clock signal 104 or it may have a different form than the input clock signal 104. In some examples, the divided clock output signal 330 may have a duty cycle that is corrected toward about 50 percent. The divided clock output signal 330 may be connected to the output handling circuit 342.

The first register 322 may be connected to the clock division value 320, the input clock signal 104, the first output from the input handling circuit 340, and the first comparison logic 326. The first register 322 may store a current, previous, or future clock division value. The first register 322 may provide this stored value to the first comparison logic 326. The first register 322 may store the clock division value 320 currently present on the input in response to a high or low signal from the first output of the input handling circuit 340 and or the input clock signal 104.

The first state machine 323 may be connected to the first output from the input handling circuit 340, the first counter 324, the input clock signal 104 and the clock enable output from the input handling circuit 340. The first state machine 323 may interact with the second state machine 333. The first state machine 323 may control whether the first counter 324 is enabled.

The first counter 324 may be connected to the first state machine 323, the input clock signal 104, the first register 322, and the first comparison logic 326. The first counter 324 may count when it is enabled by the first state machine 323. The first counter 324 may count up or down. The first counter 324 may count a number of cycles of the input clock signal 104 equal to the clock division value 320 and then reset. The first counter first counter 324 may reset upon reaching the clock division value 320. The first counter 324 may reset internally based on the value of the clock division value 320 or it may receive a reset signal from the first comparison logic 326. The first counter 324 may be disabled by the first state machine 323 or the input handling circuit 340 at some times.

The first comparison logic 326 may be connected to the first counter 324, the allow new clock signal 216, the first register 322, and the first output clock signal 328. The first comparison logic 326 may generate the first output clock signal 328 by comparing the current value of the first counter to the value stored in the first register 322. The first comparison logic 326 may generate a clock signal that has one high portion and one low portion between each time the first counter 324 is reset, thereby generating a clock signal that has a frequency equal to the input clock signal 104 divided by the clock division value 320. The first comparison logic 326 may generate a high signal that lasts within one clock cycle of the low signal, thereby creating a duty cycle as close to 50 percent as possible. In an example, the high signal may start when the first counter 324 contains a value of zero, and the low signal may start when the count matches the frequency division value divided by two. If the frequency division value is odd, the frequency division value divided by two may be rounded down to determine the start of the low signal. In an example, the division by two is accomplished by a bit-shift-left operation. In this operation, the result of the division may be rounded down to the nearest integer by operation of the circuitry and another rounding operation may not be required.

The first output clock signal 328 is connected to the first comparison logic 326 and the output handling circuit 342. The first output clock signal 328 is generated by the first comparison logic 326 and then sent to the output handling circuit 342.

The second register 332, second state machine 333, second counter 334, second comparison logic 336, and second output clock signal 338 may be configured and operated similarly to the first register 332, first state machine 323, first counter 324, first comparison logic 326, and first output clock signal 328 described above, and are therefore not described here, for brevity. The second counter 334 may operate independently of the first counter 324. The second counter 334 may not be enabled or disabled at the same times as the first counter 324 and may utilize a different clock division value 320.

The input handling circuit 340 may include one or more D flip-flops, one or more cycle delays, one or more multiplexors, one or more toggle flip-flops, one or more not gates, and one or more and gates. The input handling circuit 340 may accept as inputs an input clock signal 104, a clock enable signal 318 and a clock sync signal 214. The input handling circuit 340 may produce as outputs an internal clock enable signal, and a signal or group of signals to control the interacting state machines 344. The clock enable signal 318 may be used to gate the clock by suppressing the divided clock output 330 at some times and enabling the output at some times. The clock sync signal 214 may be used to register the clock enable signal 318. This may help to ensure that the clock enable signal is only effective after the next clock sync signal 214. The input handling circuit 340 may be responsible for ensuring that the new division value 320 and the new phase offset 321 are stored in the proper register—for example, either the first register 322 or the second register 332.

The output handling circuit 342 may include one or more D flip-flops, an output clock selection circuit 329, and a duty cycle correction circuit 331. The output handling circuit 342 may accept as inputs an input clock signal 104, a first output clock signal 328, and a second output clock signal 338. The output handling circuit 342 may produce as outputs a divided clock output signal 330.

Output clock selection circuit 329 may be contained in the output handling circuit 342. The output clock selection circuit 329 may be a multiplexer controlled by the interacting state machines 344 to determine which of the intermediate clock signals to output to the divided clock output signal 330.

The duty cycle correction circuit 331 may be connected in line with the divided clock output signal 330. The duty cycle correction circuit 331 may move the duty cycle of the internal clock signal towards 50 percent before outputting the clock signal.

The interacting state machines 344 can include a first (Counter 1) state machine 323 and a second (Counter 2) state machine 333. Alternatively, the interacting state machines 344 may include only a single state machine or one or more additional state machines. The interacting state machines 344 may be connected to the input handling circuit 340 and the first counter 324 and second counter 334.

The clock divider circuit 102 may also accept a phase offset value 321 as an input. The phase offset value 321 may be used to shift one or more of the divided clock outputs 330 by a specified number of clock cycles. When a phase shift value 321 is used, the high portion of the output clock signal may begin when the enabled counter value matches the phase shift value 321. The low portion of the output clock signal may begin when the enabled counter value matches the phase shift value 321 plus the result of dividing the frequency division value by two. The frequency division value divided by two may be rounded down when an odd frequency division value is used.

Figure 4:
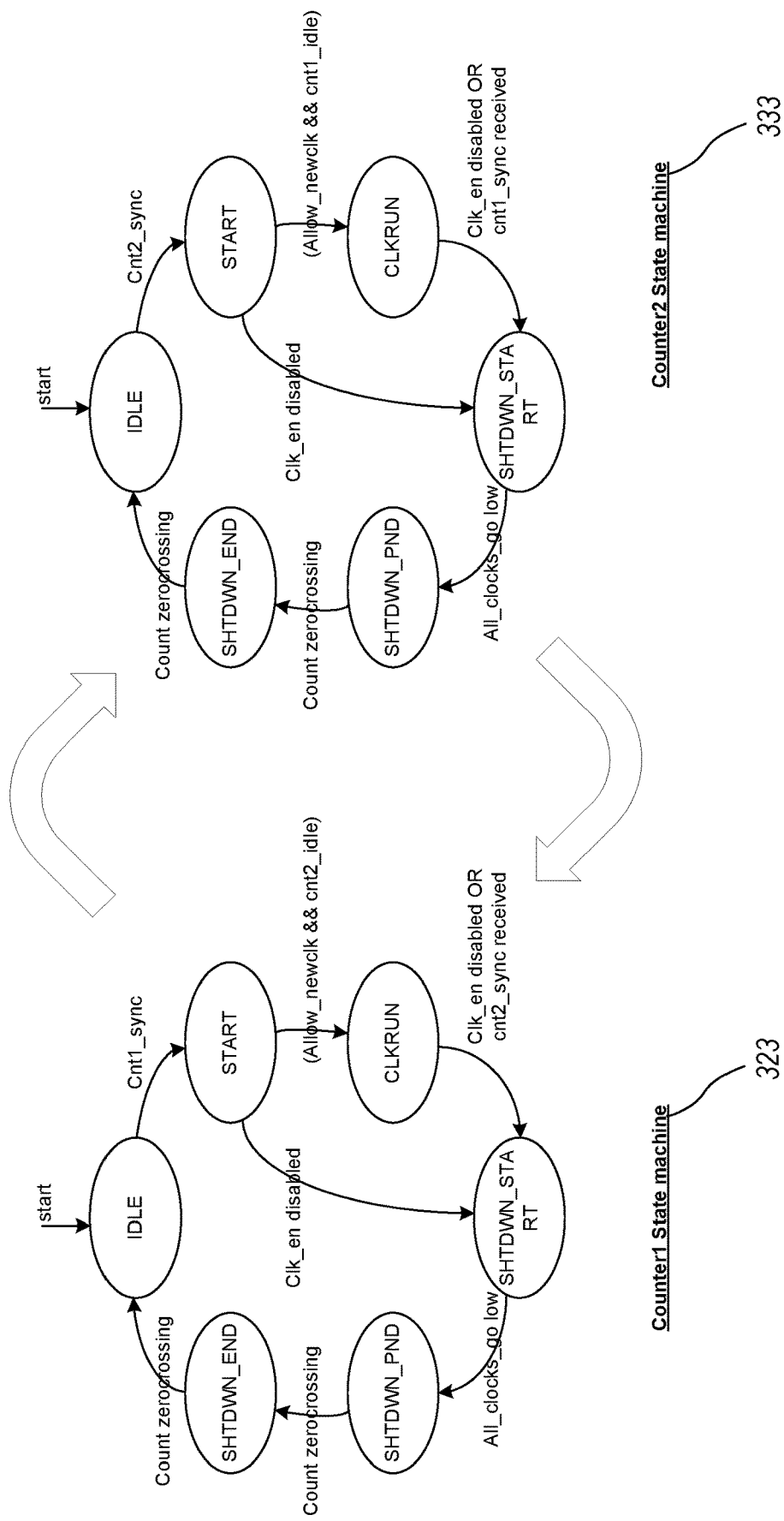
FIG. 4 is a flow chart showing an example of operating a pair of state machines.

FIG. 4 shows a flow chart 400 showing an example of the operation of an example pair of interacting state machines 344. The first state machine 323 may include 6 states: IDLE, START, CLKRUN, SHUTDWN_START, SHUTDWN_PEND, SHTDOWN_END. The second state machine 333 may include 6 states: IDLE, START, CLKRUN, SHUTDWN_START, SHUTDWN_PEND, SHTDOWN_END. Table 1 below provides example descriptions of each of the 6 states of the first state machine 323 and the second state machine 333.

TABLE 1

| STATE NAME | STATE DEFINITION |
| --- | --- |
| IDLE | Default state on startup and after shutdown of clocks. The counter is not running. Waiting for a sync signal to transition to the next state. |
| START | The counter starts running. Waiting for the other state machine to enter the IDLE state and an "allow new clock" signal to transition to the next state. Loss of the "clock enabled" signal will begin shutdown of counter. |
| CLKRUN | The counter is running and the circuit is producing clock outputs. Waiting for the other counter to receive a sync signal or the loss of the "clock enabled" signal to transition to the next state. |
| SHTDWN_START | The counter is running. The shutdown procedure is started. No more clock frequency transitions are allowed. Waiting for the output clock to go low to transition to the new state. |
| SHTDWN_PEND | The counter is still running. The middle of the shutdown procedure. Waiting for the end of a cycle of the new counter to transition to the next state. |
| SHTWDN_END | Waiting for the end of a second cycle of the new counter to transition to the next state to ensure it is OK to start new clock frequencies. The counter stops before the state machine exits this state. |

Upon the initial startup or upon reset of the clock divider circuit 102, both state machines may enter the IDLE state. In the IDLE state, the counter is not running, and the state machine is waiting for a sync signal. If the state machine receives a sync signal, the state machine may transition to the START state.

The counter begins running as soon as the state machine enters the START state. Because the counter begins counting as soon as the state machine enters the START state, the counter's behavior is predictable to the program or clock divider controller 208 controlling the clock startup or frequency change. The behavior of the counter may be predictable because the program knows the time at which the counter started and also knows the period of the counter. From the START state, the state machine may transition to the CLKRUN state or the SHTDWN_START state. If the state machine receives an "allow new clock" signal and the other state machine is in the IDLE state, the state machine may transition from the START state to the CLKRUN state. If the state machine loses the "clock enabled" signal, the state machine may transition from the START state to the SHTDWN_START state.

In the CLKRUN state, the counter may run and produce an output clock signal in combination with the comparison logic. From the CLKRUN state, the counter may transition to the SHTDWN_START state. The transition may occur upon the state machine losing the clock enabled signal or the other state machine receiving a sync signal. The interaction of the state machines may result in only one of the state machines being able to be in the CLKRUN state at one time. This may ensure that only one state machine is producing clock outputs.

In the SHTDWN_START state, the counter may continue running while the shutdown procedure is initiated. The state machine may transition from the SHTDWN_START state to the SHTDWN_PEND state after all of the clocks that will be transitioned are in the low or not active state. The SHTDWN_START state may last long enough so that the final cycle of the clock signal is as long as the steady-state signals and is not cut short producing a glitch. This glitchless behavior may help maintain the stability and accuracy of the surrounding circuits and components.

The state machine may transition from the SHTDWN_PEND state to the SHTDWN_END state after the first full cycle of the new frequency counter after the state machine enters the SHTDWN_PEND state. The state machine may transition from the SHTDWN_END state to the IDLE state after the first full cycle of the new frequency counter after the state machine enters the SHTDWN_END state. This may be the second full cycle of the new frequency counter after the state machine enters the SHTDWN_PEND state. The state machine may be designed to wait for two full clock cycles so that the clock is not glitched on the low portion or the high portion of the clock signal. In an example, waiting for two clock cycles may allow the low portion of the final clock signal of the old frequency and the low portion of the first clock cycle of the new frequency to be long enough to enable stable performance of the circuits using the output clock signal.

The first state machine 323 in connection with the first counter 324 may alternate between an inactive state and an active state together with opposite states of the second state machine 333 in connection with the second counter 334. The currently active state machine, counter, or state machine and counter combination may control delivery of the programmable frequency output clock signal 330. In an example, when a programmed frequency transition is scheduled to take place, the transition may take place in part due to the state machine, counter, or state machine and counter combination currently in the active state, handing control of the divided clock output signal 330 to the state machine, counter, or state machine and counter combination, currently in the inactive state, which then assumes the active state while the previously active state machine, counter, or state machine and counter combination, enters the inactive state. In an example, when a counter is programmed to be transitioned from the inactive state to the active state, the new frequency value is not enabled for a predetermined number of clock cycles before becoming available for output.

The first state machine 323 may be the same as the second (Counter 2) state machine 333 or the state machines may differ in one or more aspects. As mentioned above, a single state machine may be used to provide the functionality, or two or more state machines may be used.

Figure 5:
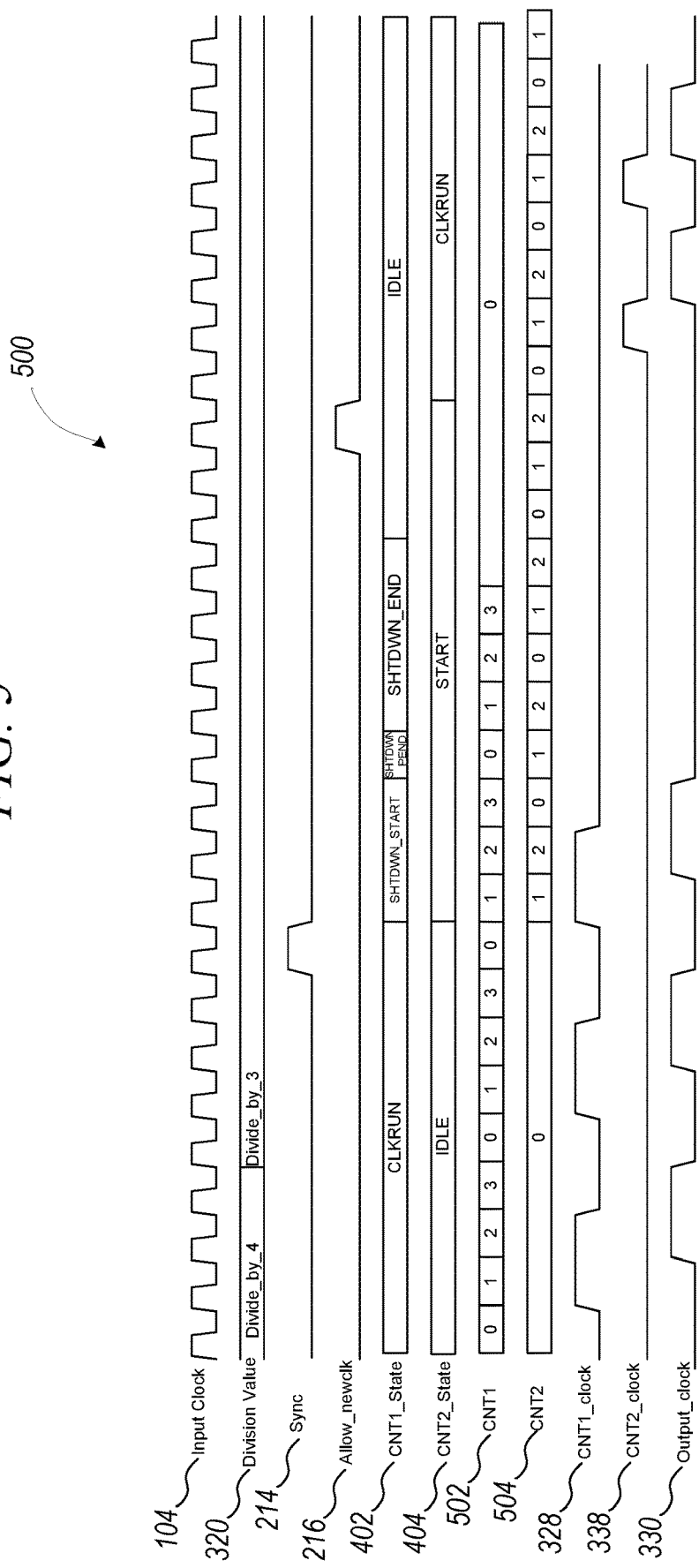
FIG. 5 is an example of a timing diagram of operating the pair of state machines.

FIG. 5 is an example of a timing diagram 500 showing a potential operation of portions of the clock divider circuit 102. The timing diagram shows the input clock signal 104, the clock division value 320, the clock sync signal 214, the allow new clock signal 216, the first (Counter 1) state machine state 402, the second (Counter 2) state machine state 404, the first (Counter 1) counter value 502, the second (counter 2) counter value 504, the first (Counter 1) output clock signal 328, the second (Counter 2) output clock signal 338, and the divided clock output signal 330.

FIG. 5 shows the clock division value 320 to initially be 4, and the first state machine state 402 to be CLKRUN with the second state machine state 404 being the IDLE state. The first counter value 502 is counting at the frequency of the input clock signal 104 and is being reset after counting up to 3. The total number of counts required for a complete cycle from 0 to 3 is 4, equal to the clock division value 320. When the first counter value 502 is 0, the first output clock signal 328 enters the high state and when the first counter value 502 is 2, the first output clock signal is in the low state. This results in the first output clock signal 328 having a frequency one-fourth that of the input clock signal 104. The duty cycle of the first output clock signal 328 is approximately 50 percent. The divided clock output signal 330 is a copy of the first output clock signal 328 delayed by one phase of the input clock signal 104.

FIG. 5 shows that after about 4 clock cycles of the input clock signal 104, the clock division value 320 changes from 4 to 3. However, no other changes in the timing diagram 500 occur at this time. After about 4 clock cycles with the clock division value 320 changed to 3, the clock sync signal 214 pulses high for approximately 1.5 clock cycles. The state machine state 402 changes to the SHTDWN_START state and the state machine state 404 changes to the START state. The first counter value 502 goes through one more cycle counting up to 3 and when it is reset to zero, the first state machine state 402 enters the SHTDWN_PEND state. After one more cycle of the first counter value 502, the first state machine state 402 enters the IDLE state.

The second state machine state 404 remains in the START state until the first state machine state 402 is IDLE and the "allow new clock" signal 214 is received, at which point the second state machine state 404 transitions to the CLKRUN state. Upon the transition to the CLKRUN state, the second intermediate output clock signal 338 becomes high when the second counter value 504 is 1. The duty cycle of the second intermediate output clock signal 338 is not 50 percent because of the odd division value. The divided clock output signal 330 now carries a phase delayed clock signal of the new frequency. In this case, the divided clock output signal 330 has been duty cycle corrected towards 50 percent.

From FIG. 5, it can be appreciated that the input clock signal 104 may be an approximately constant frequency, square wave clock with a nearly 50% duty cycle. The clock division value 320 may be an integer value. The clock sync signal 214 may be inactive in the low state and active in the high state. The clock sync signal 214 may spend the majority of the time in the inactive state. The allow new clock signal 216 may be inactive in the low state and active in the high state. The allow new clock signal 216 may spend the majority of the time in the inactive state. The first (Counter 1) state machine state 402 may be in any one of the states shown in FIG. 4, and transitions according to FIG. 4 and Table 1. The second (Counter 2) state machine state 404 may be in any one of the states shown in FIG. 4, and transitions according to FIG. 4 and Table 1. The first (Counter 1) clock output 328 may normally be in the low state and may enter the high state any time the first (Counter 1) counter value 502 is 0 at the start of the high cycle of the input clock 104. The second (Counter 2) clock output 338 may normally be in the low state and may enter the high state any time the first (Counter 2) counter value 504 is 0 at the start of the high cycle of the input clock 104. The divided clock output signal 330 may be a phase delayed output of whichever intermediate output clock is currently running. In an example, the phase delay may be a single full cycle of the input clock signal 104. In an example, the divided clock output signal 330 may be duty cycle corrected to generate a nearly 50% duty cycle clock from a non-50% duty cycle intermediate clock signal.

Figure 6:
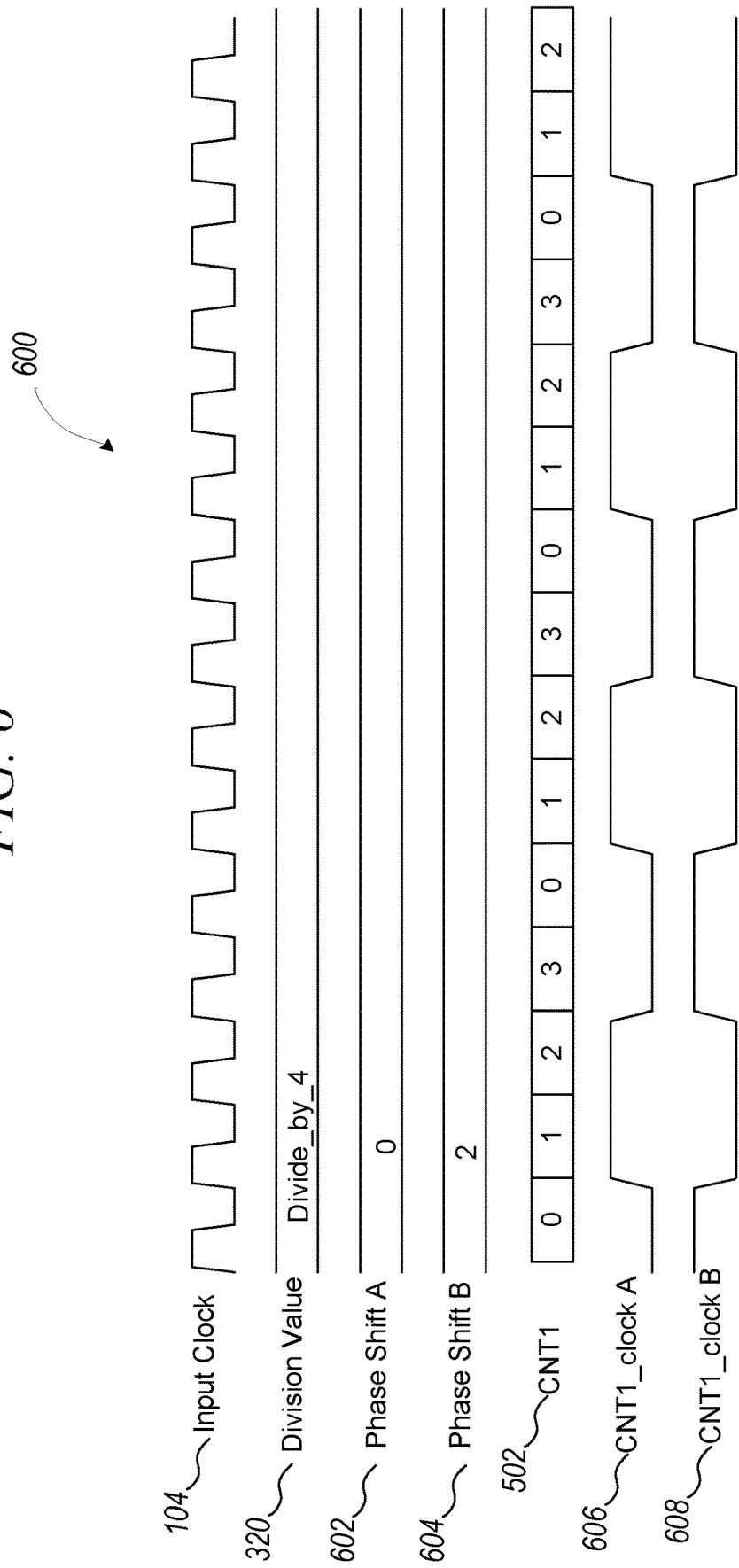
FIG. 6 is an example of a timing diagram of operating the pair of state machines.

FIG. 6 is an example of a timing diagram 600 showing a potential operation of portions of the clock divider circuit 102. In this example, there are multiple output clocks that have different phase offset values. FIG. 6 shows the input clock signal 104, the clock division value 320, a phase shift A 602, a phase shift B 604, the first counter value 502, a first counter clock A 606, and a first counter clock B 608.

The clock divider circuit 102 may have more than 2 intermediate clock values and may have more than 1 output clock signal. Some of the intermediate clock values and output clock signals may be a phase shift of another clock value. The timing diagram 600 shows an example with phase shift A 602 of 0 and phase shift B 604 of 2. A phase shift of 0 may be equivalent to not having a phase shift at all, and may be the configuration of clock divider circuits 102 without phase shift circuitry. A phase shift of 2 may result in the clock output being delayed by 2 clock cycles of the input clock signal 104.

Timing diagram 600 shows the first counter clock A 606 having a frequency of one-fourth the input clock signal 104 and having a phase similar to the first output clock signal 328 of the timing diagram 500. The first counter clock B 608 has a frequency of one-fourth the input clock signal 104 and is delayed by two cycles of the input clock signal 104 from the first counter clock A 606. Phase shifted clock values may be desired in order to limit inductive and capacitive coupling between components, to limit or normalize power consumption, or for some other design reason.

Figure 7:
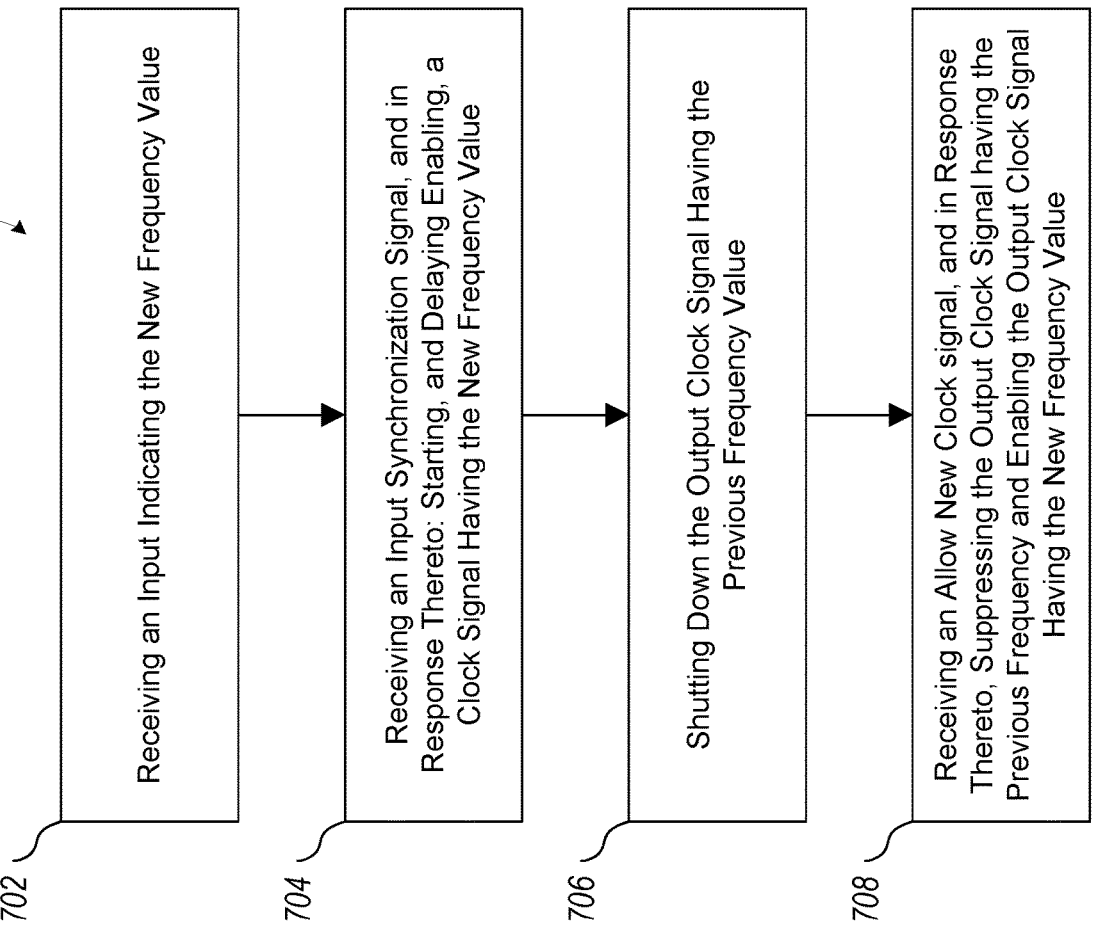
FIG. 7 is a flow chart showing an example of a method for generating a divided clock signal.

FIG. 7 is a flow chart 700 showing an example of a method for switching division values of a divided clock signal. The method includes a first step 702—receiving an input indicating the new frequency value. The method also includes a second step 704—receiving an input synchronization signal, and in response thereto: starting, and delaying enabling, a clock signal having the new frequency value. The method also includes a third step 706—shutting down the output clock signal having the previous frequency value. The method includes a fourth step 708—receiving an "allow new clock" signal, and in response thereto, suppressing the output clock signal having the previous frequency and enabling the output clock signal having the new frequency value.

The method shown in flow chart 700 allows a user or program to change the frequency value of clock divider. The clock divider circuit receives an input from a user, program, or other source in step 702. The clock divider circuit may store the input, such as by using a register, or the clock divider circuit may simply rely on the source of the new frequency value to maintain the new frequency value signal until the frequency transition is completed or the new frequency value signal is no longer needed. The clock divider circuit receives an input synchronization signal in step 704. In response to this input synchronization signal, the clock divider circuit starts a clock signal having the requested new frequency value. However, the clock signal may not be enabled initially. In an example, the clock divider circuit waits a predetermined amount of time until starting the clock corresponding to the new frequency value. In an example, the clock circuit corresponding to the new frequency value represents a fully functioning clock circuit but the output is suppressed or otherwise unavailable to the user or program.

The clock divider circuit shuts down the output clock signal having the previous frequency value in step 706. In an example, the output clock signal is shut down after a predetermined number of cycles of the previous frequency value clock signal. In an example, the output clock signal is shut down after a predetermined number of cycles of the new frequency value clock signal. In an example, the clock divider circuit ensures that the previous frequency clock signal is shut down without producing a glitched clock signal. The clock divider circuit receives an "allow new clock" signal in step 708, an in response to this signal, the clock divider circuit suppresses the output clock signal having the previous frequency value and enables the output clock signal having the new frequency value. In an example, the output clock signal has already been internally shut down by the time the output signal is suppressed, such as being shut down by step 706.

In an example, on or more of the steps in 700 may be performed on a portion of a clock divider circuit such as the portion of a clock divider circuit shown in FIG. 3. In an example, one or more of the input indicating a new frequency value in step 702, the input synchronization signal in step 704, and the "allow new clock" signal in step 708 may be produced by a clock divider controller, such as the clock divider controller 208 shown in FIG. 2. In an example, the clock divider controller 208 may control one or more clock divider circuits performing one or more operation in flow chart 700 simultaneously. In an example, one or more steps in the flow chart 700 may be rearranged and placed in a new order. In an example, one or more of the steps in flow chart 700 may occur simultaneously.

Figure 8:
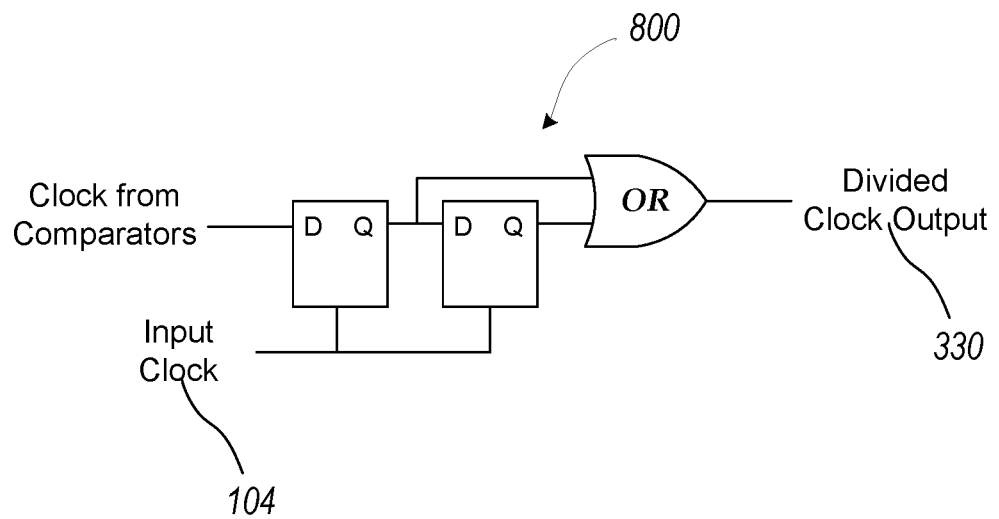
FIG. 8 is a schematic drawing of an example of portions of a circuit for duty cycle correction.

FIG. 8 is a schematic drawing of an example of portions of a duty cycle correction circuit 800. The duty cycle correction circuit 800 may accept as inputs the input clock signal 104 and the selected intermediate clock signal from the comparator circuits. The duty cycle correction circuit 800 may produce as outputs the output clock signal 330. The duty cycle correction circuit 800 may include one or more D flip flops, and one or more OR gates.

The duty cycle correction circuit 800 may be used to correct or adjust the duty cycle of the divided clock output signal 330 towards 50 percent. The duty cycle correction circuit 800 may be inserted in line with the divided clock output signal 330. In an example, the duty cycle correction circuit 800 may extend the high clock signal by approximately one-half period of the input clock 104. For even division values that do not require duty cycle correction, it may be necessary to bypass the duty cycle correction circuit 800.

What is claimed is:

1. A multifrequency clock divider circuit for generating, from a given frequency input clock signal, a programmable frequency output clock signal, the clock divider circuit comprising:
   a first counter;
   a second counter, alternating between an active state and an inactive state together with opposite states of the first counter to control delivery of the programmable frequency clock signal; and
   wherein when the first counter is programmed to be transitioned from the inactive state to the active state, the second counter continues to maintain the active state and a previous frequency value of the output clock signal for a predetermined number of clock cycles before transitioning to the inactive state and handing control of the output clock signal to the first counter which assumes the active state.

2. The clock divider circuit of claim 1, wherein when the first counter is programmed to be transitioned from the inactive state to the active state, a new frequency value of the output clock signal is not enabled for a second predetermined number of clock cycles before becoming available for output by the clock divider circuit.

3. The clock divider circuit of claim 2, wherein an asynchronously received programmed transition between frequency values of the output clock signal is synchronized to a sync signal, and wherein a completed programmed transition between frequency values of the output clock signal is synchronized to an "Allow New Clock" signal.

4. The clock divider circuit of claim 1, further comprising:
   a first state machine, controlling the first counter, to count according to the given frequency input clock signal and reset upon reaching a programmable first clock division value corresponding to a new frequency value of the output clock signal; and
   a second state machine, controlling the second counter, to count according to the given frequency input clock signal and disabled from counting upon reaching the first predetermined number of clock cycles.

5. The clock divider circuit of claim 4, wherein the first counter begins counting in response to a program request to transition from the inactive state to the active state.

6. The clock divider circuit of claim 4, further comprising:
   a first register, interacting with the first counter, the first register configured to store the programmable first clock division value for resetting the first counter; and
   a second register, interacting with the second counter, the second register configured to store a programmable second clock division value for use by the second counter when the second counter is counting.

7. The clock divider circuit of claim 6, wherein, in response to a program request to transition from the inactive state to the active state:
   the first register records the programmable first clock division value corresponding to a new frequency value of the output clock signal; and
   the second register maintains the programmable second clock division value corresponding to the previous frequency value of the output clock signal.

8. The clock divider circuit of claim 1, further comprising duty cycle adjustment circuitry for adjusting the duty cycle of the output clock signal toward 50% in response to the programmable frequency output clock signal being controlled by a clock division value having an odd integer value.

9. The clock divider circuit of claim 1, wherein a programmable phase shift input is used to adjust a phase shift value of the programmable frequency output clock signal.

10. The clock divider circuit of claim 9, further comprising a second programmable frequency output clock signal, wherein the second programmable frequency clock output signal has a same frequency value as the first programmable frequency clock output signal, wherein the second programmable frequency clock output signal has a phase shift value that is different from the phase shift value of the first programmable frequency output clock signal.

11. A method for changing a frequency value of a programmable frequency output clock signal generated from a given frequency input clock signal from a previous frequency value to a new frequency value, the method comprising;

receiving an input indicating the new frequency value;
receiving an input synchronization signal and, in response thereto:
  starting, and delaying enabling, an output clock signal having the new frequency value; and
  shutting down the output clock signal having the previous frequency value;
receiving an "Allow New Clock" signal, and, in response thereto, suppressing the output clock signal having the previous frequency value and enabling the output clock signal having the new frequency value.

12. The method of claim 11 wherein the input synchronization signal and the "Allow New Clock" signal are generated by a clock divider controller circuit.

13. The method of claim 12 wherein the clock divider controller circuit is configured to sequence the "Allow New Clock" signal to align rising edges of two or more output clock signals taking on a new frequency value.

14. The method of claim 11 wherein the output clock signal having the new frequency value and the output clock signal having the previous frequency value are generated by two independent counters.

15. The method of claim 14 wherein the two independent counters are controlled by a pair of interacting state machines.

16. A multifrequency clock divider system for generating, from a given frequency input clock signal, at least one programmable frequency output clock signal, the clock divider system comprising:
  clock divider controller circuitry; and
  at least one multifrequency clock divider circuit, the at least one multifrequency clock divider circuit comprising:
    a first counter;
    a second counter, alternating between an active state and an inactive state together with opposite states of the first counter to control delivery of the at least one programmable frequency clock signal; and
    wherein when the first counter is programmed to be transitioned from the inactive state to the active state, the second counter continues to maintain the active state and a previous frequency value of the output clock signal for a first predetermined number of clock cycles before transitioning to the inactive state and handing control of the output clock signal to the first counter which assumes the active state; and
    wherein the clock divider controller circuitry interacts with the at least one multifrequency clock divider circuit to establish the at least one programmable frequency output clock signal having a programmable frequency value.

17. The clock divider system of claim 16, wherein the clock divider controller circuitry is configured to issue an "Allow New Clock" signal to complete a programmed transition between frequency values of the at least one programmable frequency clock signal.

18. The clock divider system of claim 17, wherein the clock divider controller circuitry is configured to sequence the "Allow New Clock" signal to align rising edges of the at least one programmable frequency output clock signal.

19. The clock divider system of claim 18, wherein the clock divider controller circuitry is configured to use a least common multiple of individual clock division values to sequence the "Allow New Clock" signal.

20. The clock divider system of claim 16 wherein the at least one programmable frequency output clock signal is used to synchronize operation of datapath block circuits in a radio-frequency converter.

* * * * *